United States Patent [19]

Okumura et al.

[11] Patent Number: 5,375,135
[45] Date of Patent: Dec. 20, 1994

[54] SEMICONDUCTOR LASER DEVICE

[75] Inventors: Toshiyuki Okumura, Tenri; Fumihiro Konushi, Nara; Tatsuya Morioka, Tenri; Narihito Matsumoto, Yokohama, all of Japan

[73] Assignee: Sharp Kabushiki Kaisha, Osaka, Japan

[21] Appl. No.: 48,887

[22] Filed: Apr. 15, 1993

[30] Foreign Application Priority Data

Apr. 15, 1992 [JP] Japan .................................. 4-95579
Apr. 15, 1992 [JP] Japan .................................. 4-95580

[51] Int. Cl.$^5$ .............................................. H01S 3/19
[52] U.S. Cl. .................................... 372/46; 372/45
[58] Field of Search ................................ 372/45, 46

[56] References Cited

U.S. PATENT DOCUMENTS

| | | | |
|---|---|---|---|
| 5,173,912 | 12/1992 | Iwase et al. | 372/45 |
| 5,175,739 | 12/1992 | Takeuchi et al. | 372/45 |
| 5,260,959 | 11/1993 | Hayakawa | 372/45 |
| 5,282,218 | 1/1994 | Okajima et al. | 372/45 |
| 5,287,377 | 2/1994 | Fakuzawa et al. | 372/45 |

FOREIGN PATENT DOCUMENTS

| | | |
|---|---|---|
| 61-295685 | 12/1986 | Japan . |
| 62-2581 | 1/1987 | Japan . |
| 62-86782 | 4/1987 | Japan . |
| 3-58490 | 3/1991 | Japan . |

OTHER PUBLICATIONS

Matsumoto, N., et al., "Low threshold current, high quantum efficiency 1.5 μm GaInAs-GaInAsP GRIN-SCH single quantum well laser diodes" *IEEE Journal of Quantum Electronics* 27(6):1790–1793, Jun. 1991.
Tanbun-Ek, T., et al., "Very low threshold InGaAs/InGaAsP graded index separate confinement heterostructure quantum well lasers grown by atmospheric pressure metalorganic vapor phase epitaxy" *Applied Physics Letters* 55(22):2283–2285, Nov. 1989.
Ishiguro, H., et al., "InGaAsP multiple quantum well lasers with planar buried heterostructure prepared by metalorganic chemical vapor deposition" *Applied Physics Letters* 52(25):2099–2101, Jun. 1988.
Zhu, L. D., et al., "Optical gain in GaAs/GaAlAs graded-index separate-confinement single-quantum-well heterostructures" *IEEE Journal of Quantum Electronics* 25(6):1171–1178, Jun. 1989.

*Primary Examiner*—James W. Davie
*Attorney, Agent, or Firm*—Morrison & Foerster

[57] ABSTRACT

A semiconductor laser device includes a substrate and a laminated structure formed on a top face of the substrate. The laminated structure includes (a) first and second guide layers and (b) a quantum well structure of compound semiconductor interposed between the first and second guide layers. The quantum well structure serves as a resonator of the device and includes at least one quantum well layer and at least one barrier layer. The quantum well layer has a thickness $L_z$ and the barrier layer has the energy gap larger than the energy gap of the quantum well layer so as to form a energy difference $V_0$ between the bottom of the conduction band of the quantum well layer and the bottom of the conduction band of the barrier layer. The relationship represented by formula (I) is satisfied:

$$L_z < h/2(2m^*V_0)^{\frac{1}{2}} \qquad (I)$$

wherein h is Planck's constant and $m^*$ is the effective mass of electrons within the quantum well layer.

8 Claims, 9 Drawing Sheets

THICKNESS OF QUANTUM WELL LAYER

SEMICONDUCTOR LASER DEVICE

BACKGROUND OF THE INVENTION

1. Field of the Invention

The present invention relates to semiconductor lasers and, more particularly, to semiconductor lasers having a quantum well structure which can be used for fiber optic communication, information processing utilizing light, and the like.

2. Description of the Related Art

Semiconductor laser devices having a quantum well structure of compound semiconductor material are, based on theoretical studies, expected to have excellent characteristics of performance such as a low threshold value, high conversion efficiency and small temperature dependency. Recently, intensive efforts have been made for research and development of these devices.

A quantum well semiconductor laser device is generally known to have the following structural features.

A quantum well structure is interposed between a pair of guide layers and serves as a resonator of the laser device. The quantum well structure includes at least one quantum well layer and at least one barrier layer. The thickness of the quantum well layer is set sufficiently thin to generate quantum effect for electrons injected into the quantum well structure.

The above-mentioned advantages of quantum well semiconductor laser devices are based on the following theory. That is, because such a device allows diffusion of electrons only in directions in two dimensions and thus forms quantum levels within the quantum well layer, changes in density of states of electrons would be more abrupt and gain distribution generated by electrons would be more restricted than in the case of semiconductor laser devices having conventional double heterostructures wherein electrons diffuse in directions in three dimensions. On the other hand, because holes have heavier mass and thus smaller energy differences among existing quantum levels compared with the case of electrons, quantum effect is usually not significantly attained for holes within the quantum well structure. Therefore, characteristics of a quantum well semiconductor laser device are mainly affected by density of states of electrons.

The above-mentioned abrupt changes in density of states of electrons are known to be shown by electrons in all quantum levels, regardless of the number of quantum well layers and the length of the resonator of a semiconductor laser device. For this reason, the number of quantum levels allowed to exist within the quantum well structure, as well as the number of quantum well layers and the length of the resonator, have attracted little or no specific attention in studies for manufacturing quantum well semiconductor laser devices.

However, conventional quantum well semiconductor laser devices have not shown as good characteristics as have been expected. For example, semiconductor laser devices for household machines, such as those used for fiber optic communication between a telephone central office and the homes of subscribers, are often used under rigorous conditions and thus especially require satisfactory performance characteristics at high temperature. Nonetheless, conventional quantum well semiconductor laser devices to date have not satisfactorily realized desired characteristics such as those enabling laser oscillation at significantly high temperature while preventing saturation of optical output. This particular problem is believed to be caused because of the following reason. That is, as temperature of the semiconductor laser device rises and a threshold current density required for attaining laser oscillation increases, carriers injected into a quantum well layer overflow to an adjacent barrier layer, thereby further accelerating increase in the threshold current density.

To overcome the above-mentioned problem, attempts have been made to coat the faces of the resonator of a quantum well semiconductor laser device with dielectric layers having high reflectivity. Such coating can reduce the threshold current density and thus enables laser oscillation at higher temperature. However, these semiconductor laser devices are difficult to use for generating optical output of significantly high intensity.

Further, when used as a component in a fiber optic communication system, a semiconductor laser device is usually coupled with an optical fiber through a lens interposed therebetween. In order to improve transmission characteristics of the system, the semiconductor laser device should have high coupling efficiency with the optical fiber. It is known that achievement of higher coupling efficiency makes it desirable for laser light emitted from the semiconductor laser device to have a circular image rather than an elliptic image along a plane parallel to the light-emitting face of the device. Therefore, this desired characteristic would preferably be incorporated into structural features of quantum well semiconductor laser devices.

SUMMARY OF THE INVENTION

In accordance with one aspect of the present invention, a semiconductor laser device having a resonator includes: a substrate; and a laminated structure formed on a top face of the substrate, the laminated structure including (a) first and second guide layers and (b) a quantum well structure of compound semiconductor interposed between the first and second guide layers, the quantum well structure serving as the resonator and including at least one quantum well layer and at least one barrier layer; and wherein the quantum well layer has a thickness $L_z$ and the barrier layer has the energy gap larger than the energy gap of the quantum well layer so as to form a energy difference $V_0$ between the bottom of the conduction band of the quantum well layer and the bottom of the conduction band of the barrier layer; and wherein the relationship represented by formula (I) is satisfied:

$$L_z \leq h/2\ (2m^*V_0)^{\frac{1}{2}} \qquad (I)$$

wherein h is Planck's constant and $m^*$ is the effective mass of electrons within the quantum well layer.

In accordance with another aspect of the present invention, a semiconductor laser device having a resonator includes: a substrate; and a laminated structure formed on a top face of the substrate, the laminated structure including (a) first and second guide layers and (b) a quantum well structure of compound semiconductor interposed between the first and second guide layers, the quantum well structure serving as the resonator and including a plurality of quantum well layers and a plurality of barrier layers stacked in alternating manner; and wherein the number of the quantum well layers is in the range of 6 to 10, and the length of the resonator may be in the range of 250 $\mu$m to 700 $\mu$m.

The invention described herein makes possible, among others, the advantages of (1) improving temperature characteristics of a quantum well semiconductor laser device by reducing overflow of carriers and obtaining sufficient optical output when the device is operated at high temperature; and (2) enabling a quantum well semiconductor laser device to realize high coupling efficiency with en optical fiber and the like.

These and other advantages of the present invention will become apparent to those skilled in the art upon reading and understanding the following detailed description with reference to the accompanying drawings.

DESCRIPTION OF THE PREFERRED EMBODIMENTS

Figure 5:
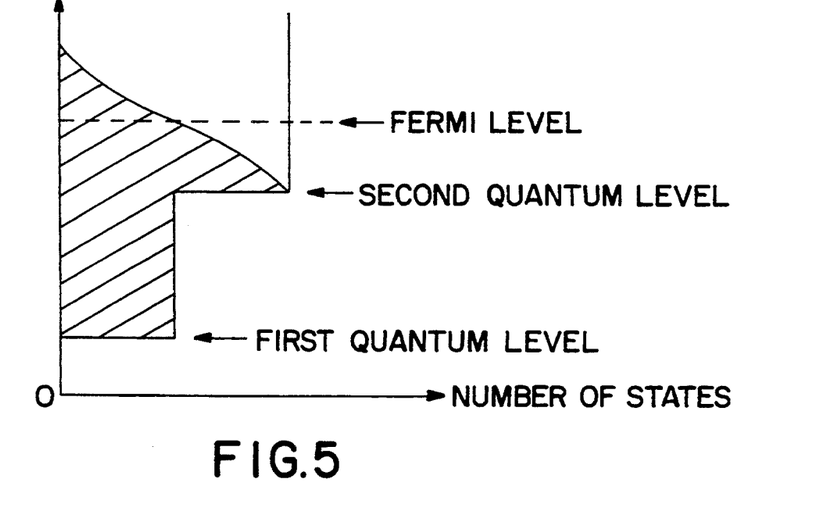
FIG. 5 is a graph illustrating a distribution of electrons at an exemplary high temperature condition which are injected into a quantum well structure which allows for two quantum levels to exist therein.

A quantum well semiconductor laser device generally has a low threshold current density at around room temperature and thus oscillates laser light even with a relatively small amount of injected carriers. Such a laser oscillation has a wavelength corresponding to the lowest quantum level (n=1) of electrons even where the quantum well structure allows for more than two quantum levels to exist therein. As the temperature of the semiconductor laser device rises and accordingly the threshold current density increases, however, injected carriers are also placed in the second lowest quantum level (n=2) and laser oscillation begins with a wavelength corresponding to the second lowest quantum level. FIG. 5 illustrates a distribution of electrons in such a situation (i.e., when the quantum well semiconductor laser device is operated at high temperature). This distribution is obtained as a product of Fermi distribution function and density of states of electrons. As is represented in FIG. 5, under high temperature conditions there is an increased number of electrons having higher energy, which would overflow from a quantum well layer to an adjacent barrier layer, thereby further accelerating the increase of the threshold current density.

According to an embodiment of semiconductor laser device of this invention, a thickness $L_z$ of a quantum well layer within the quantum well structure and the energy difference $V_0$ between the bottom of the conduction band of the quantum well layer and the bottom of the conduction band of an adjacent barrier layer satisfy the relationship represented by formula (I):

$$L_z < h/2 \, (2m^*V_0)^{\frac{1}{2}} \tag{I}$$

wherein h is Planck's constant and m* is the effective mass of electrons within the quantum well layer. When this relationship is satisfied, the quantum well structure allows only for the lowest quantum level (n=1) to exist therein. Therefore, even when operated at high temperature, a semiconductor laser device of this invention does not oscillate with a wavelength corresponding to the second lowest quantum level, and thus can restrict the overflow of carriers.

According to another embodiment of semiconductor laser device of this invention, the number of the quantum well layers within a quantum well structure is set in the range of 6 to 10, and the length of the resonator of the device is set in the range of 250 μm to 700 μm. By selecting the parameters of semiconductor laser device in the specified range, improved temperature characteristics of the device are obtained and, at the same time, high coupling efficiency of the device with optical fiber and the like is facilitated.

EXAMPLE 1

Figure 1:
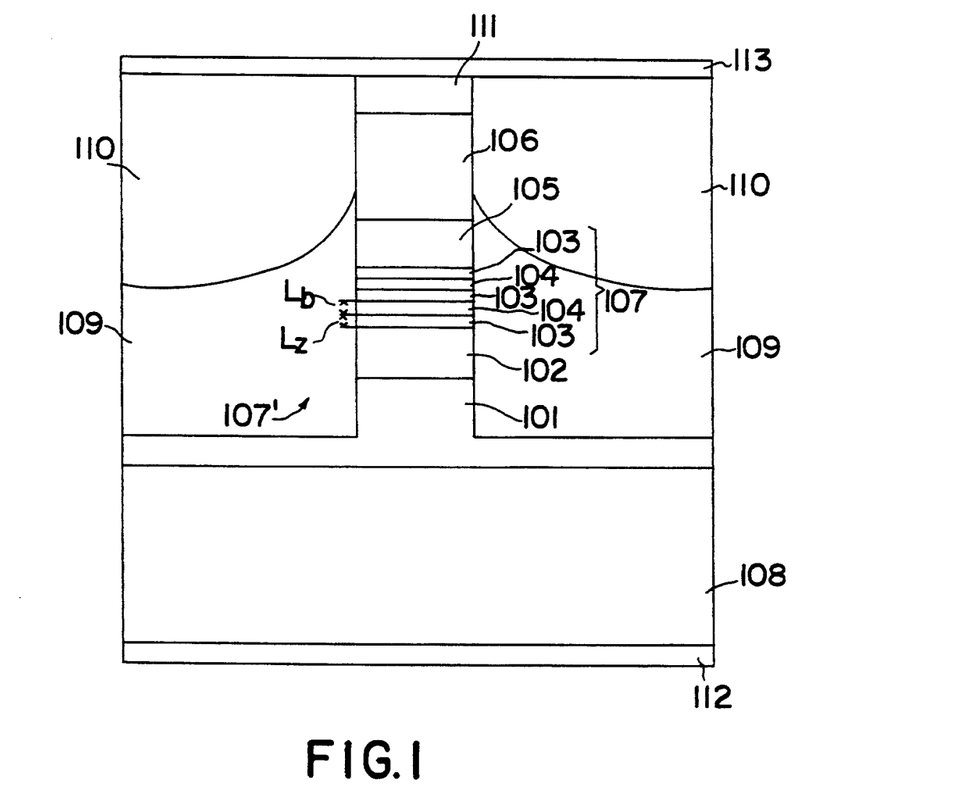
FIG. 1 is a schematic elevation view illustrating an embodiment of a semiconductor laser device according to the present invention.

With reference to FIG. 1, a schematic elevation view of an embodiment of a semiconductor laser device according to the present invention is illustrated.

The semiconductor laser device of FIG. 1 has a substrate 108 made of n-type InP and a laminated structure formed on the top face of the substrate 108. The laminated structure includes, in the direction away from the substrate 108 (i.e., vertically as viewed in the drawing), an n-cladding layer 101 made of n-type InP, a first guide layer 102 made of InGaAsP ($\lambda_g$=1.1 micrometers (μm); thickness=150 nanometers (nm)), an active layer 107 having a quantum well structure, a second guide layer 105 made of InGaAsP ($\lambda_g$=1.1 μm; thickness=150 nm), a p-cladding layer 106 made of p-type InP, and a p+-cap layer 111 made of p+-type InGaAsP ($\lambda_g$=1.3 μm). Within the active layer 107, a plurality of quantum well layers 103 each made of InGaAsP ($\lambda_g$=1.37 μm; thickness=8 nm), and a plurality of barrier layers 104 each made of InGaAsP ($\lambda_g$=1.1 μm; thickness=12 nm) are stacked in alternating manner. $\lambda_g$ is the constant corresponding to the band gap energy $E_g$ of each semiconductor material, and is obtained according to the formula: $E_g = hc/\lambda_g$, wherein h is Planck's constant and c is the speed of light.

The above laminated structure is obtained by sequentially growing on the substrate 108 each of the layers 101, 102, 107, 105, 106 and 111 by use of conventional epitaxial growth method. The laminated structure is then subjected to etching treatment to form a stripe-shaped portion 107'. This stripe-shaped portion is provided on both of its side faces with a current blocking layer including a p-type InP layer 109 and an n-type InP layer 110 in a manner as shown in FIG. 1. An electrode 112 is formed on the bottom face of the substrate 108, and another electrode 113 is formed to be in contact with the p+-cap layer 111 and the n-type InP layer 110, thereby yielding the semiconductor laser device of this example.

Figure 2:
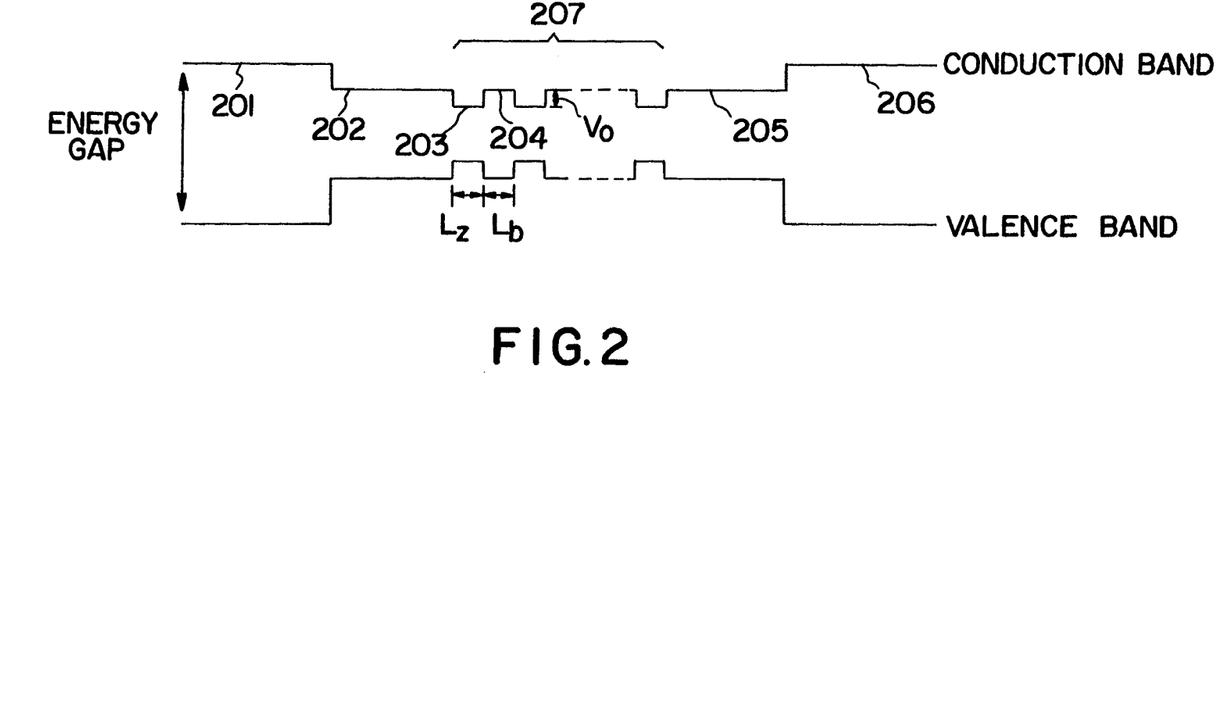
FIG. 2 is a conceptual view illustrating the energy band structure of and around the quantum well structure of the semiconductor laser device in FIG. 1.

FIG. 2 illustrates the energy band structure of and around the active layer of the above semiconductor laser device.

An energy band of the portion 207 of the energy band structure in FIG. 2 corresponds to the energy band of the active layer 107 in FIG. 1. Further in FIG. 2, energy levels 201, 202, 203, 204, 205 and 206 respectively represent the bottoms of the conduction bands of the n-cladding layer 101, the first guide layer 102, the quantum well layer 103, the barrier layer 104, the second guide layer 105 and the p-cladding layer 106. The thickness of the quantum well layer 103 and that of the barrier layer 104 are respectively shown as $L_z$ and $L_b$, and the energy difference between the energy level 203 of the quantum well layer and the energy level 204 of the barrier layer is shown as $V_0$.

According to the present invention, the relationship between the thickness $L_z$ and the energy difference $V_0$ preferably satisfies the formula (I) as illustrated above. The thickness $L_z$ is set optionally but should be sufficiently thin to attain quantum effect for electrons injected into the quantum well layer 103. The thickness $L_b$ is also set optionally but should be sufficiently thick to prevent the quantum well layers 103, if more than two of them exist in the active layer 107, from being in contact with each other. The energy difference $V_0$ can be changed as desired by changing the composition ratio of semiconductor material(s) used for the quantum well layer 103 and/or the barrier layer 104, and does not depend on either of the thicknesses $L_z$ and $L_b$. In addition, compound semiconductor material(s) other than InGaAsP may be used for the quantum well layer 103 and/or the barrier layer 104 as long as desired energy difference $V_0$ can be obtained.

Figure 3:
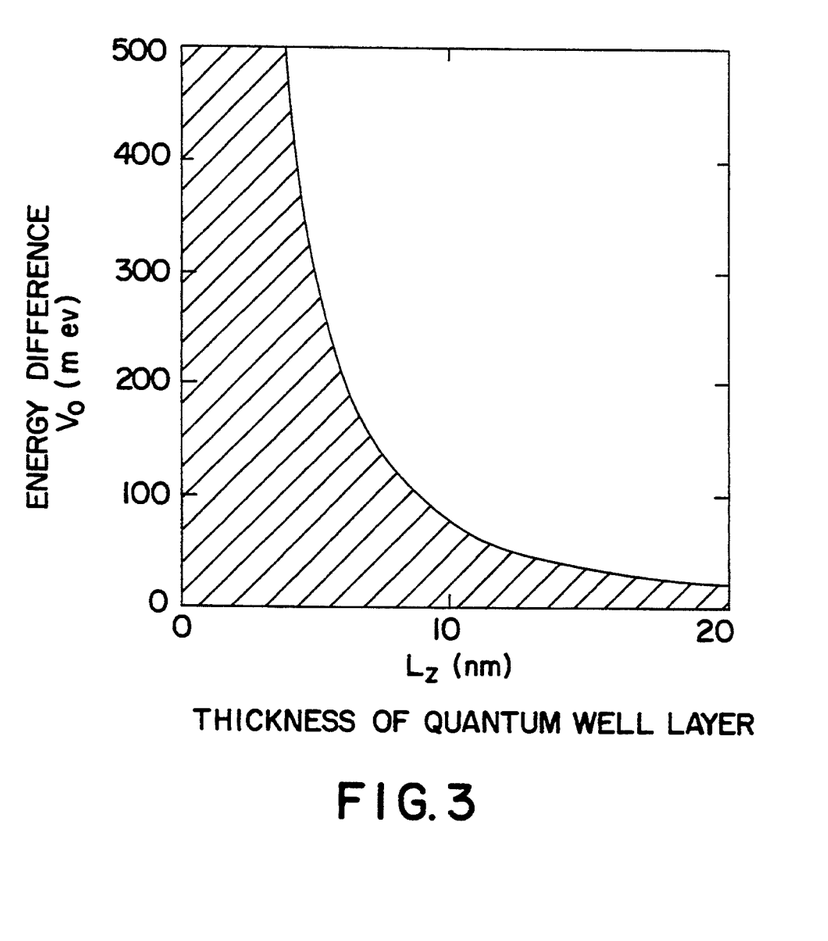
FIG. 3 is a graph illustrating a preferred relationship between $L_z$ and $V_0$ for semiconductor laser devices according to the present invention, wherein electrons have an effective mass of 0.05 $m_0$.

FIG. 3 illustrates a preferred relationship between $L_z$ and $V_0$ for semiconductor laser devices such as that shown in Example 1. That is, when a quantum well structure includes a quantum well layer made of InGaAsP ($\lambda_g = 1.37$ μm) and therefore the effective mass m* of electrons therein is represented as 0.05 $m_0$ ($m_0$ is the rest mass of electrons), the relationship of the above formula (I) is satisfied in the shaded area shown in FIG. 3. Because each of the quantum well layers 103 of the semiconductor laser device of Example 1 has a thickness $L_z$ of 8 nm and the energy difference $V_0$ thereof is determined to be 52 milli-electron volts (meV), the relationship of the formula (I) is satisfied. Thus, only the lowest quantum level (n=1) is allowed to exist within the quantum well structure of this semiconductor laser device.

Figure 4A:
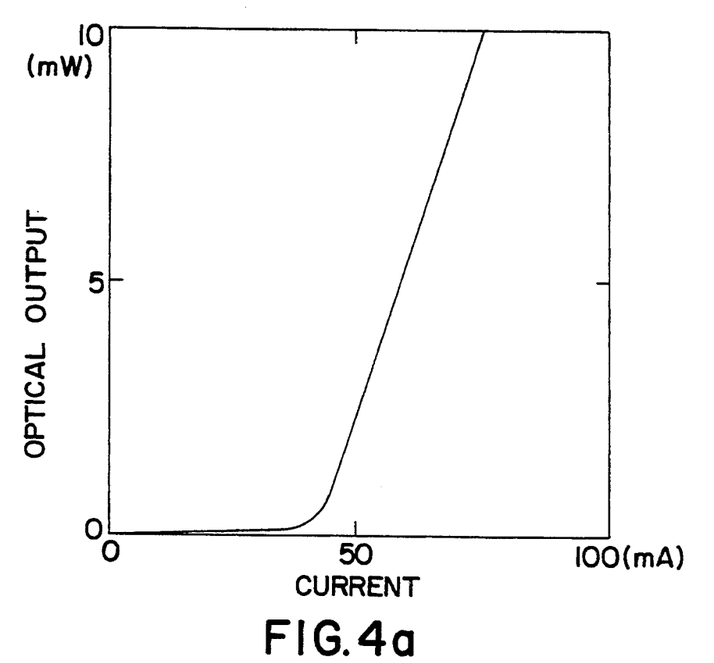
FIG. 4a is a graph illustrating current vs. optical output characteristics of the semiconductor laser device of FIG. 1.
Figure 4B:
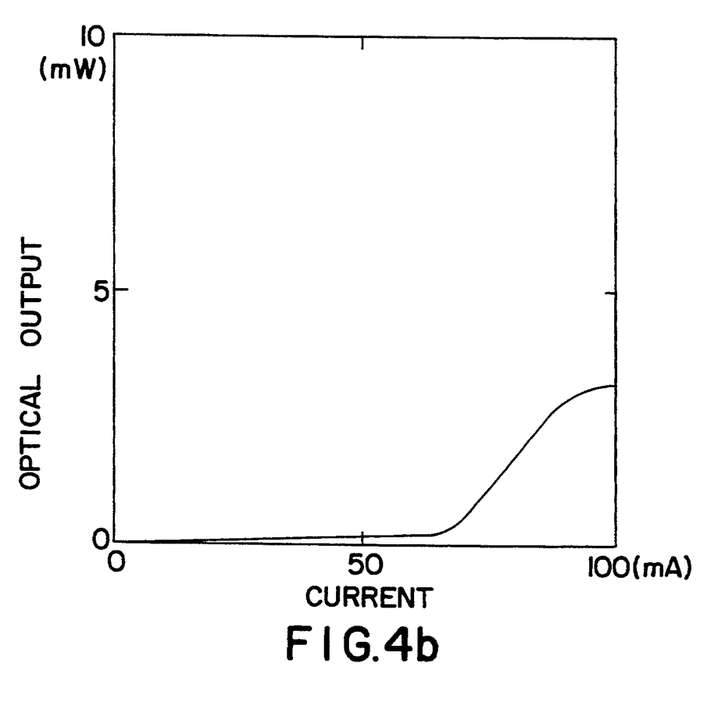
FIG. 4b is a graph illustrating current vs. optical output characteristics of a conventional semiconductor laser device.

FIG. 4a illustrates current vs. optical output characteristics, measured at 85° C., of the semiconductor laser device shown in Example 1. It can be seen that this device is free from saturation of optical output even at such a high temperature and shows excellent current vs. optical output characteristics. FIG. 4b illustrates current vs. optical output characteristics, also measured at 85° C., of a semiconductor laser device which has been prepared in the same manner as illustrated in Example 1 except that its quantum well layer has the thickness $L_z$ of 15 nm. It can be seen that this device suffers from significant saturation of optical output and shows inferior characteristics compared with the device according to the present invention.

Although the first and second guide layers 102 and 105, respectively, of the semiconductor device of Example 1 have uniform composition ratio along the transverse direction of each layer, these layers may have a so-called GRIN-SCH (Graded Index Separate Confinement Hetero) structure wherein composition ratio is changed in stepwise manner along the transverse direction of the layers. In addition, the above semiconductor device may have a single quantum well layer instead of a plurality of quantum well layers illustrated above. When a quantum well structure has only a single quantum well layer, a barrier layer may be integrated into a guide layer.

EXAMPLE 2

Figure 6:
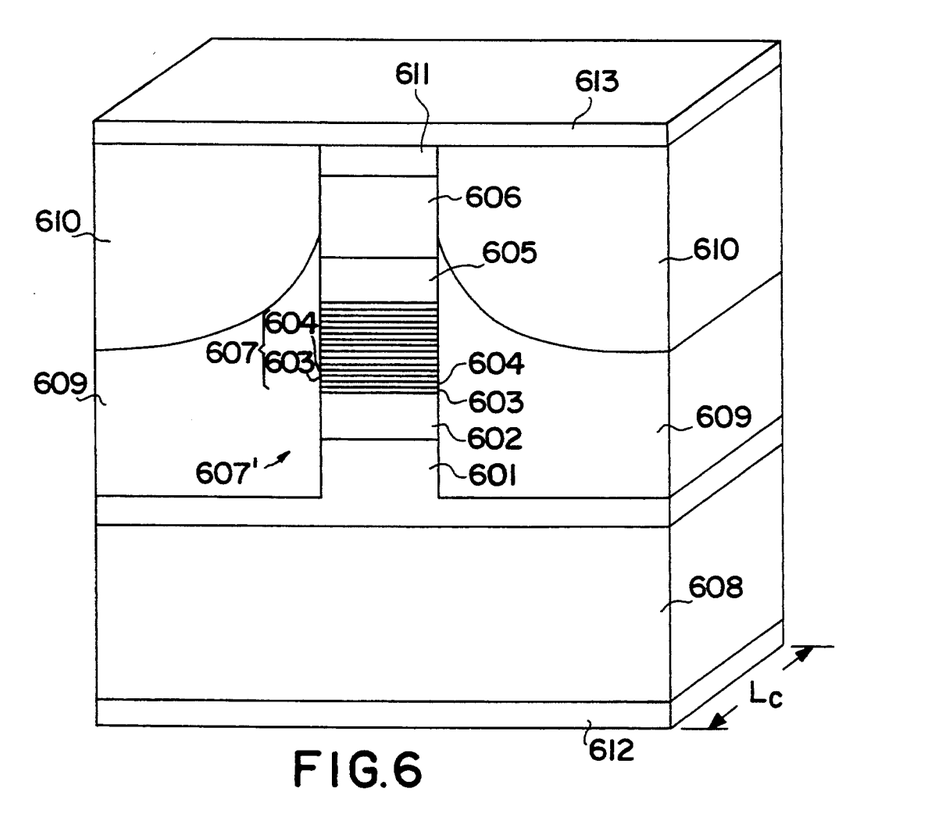
FIG. 6 is a schematic perspective view illustrating another embodiment of a semiconductor laser device according to the present invention.

With reference to FIG. 6, a schematic perspective view of another embodiment of a semiconductor laser device according to the present invention is illustrated.

The semiconductor laser device of FIG. 6 has a substrate 608 made of n-type InP and a laminated structure formed on the top face of the substrate 608. The laminated structure includes, in the direction away from the substrate 608, an n-cladding layer 601 made of n-type InP, a first guide layer 602 having a four-layer GRIN-SCH structure made of InGaAsP ($\lambda_g = 0.95, 1.0, 1.05$ and 1.1 μm for the respective layers in the direction away from the n-cladding layer 601; thickness in total = 100 nm), an active layer 607 having a quantum well structure, a second guide layer 605 having a four-layer GRIN-SCH structure made of InGaAsP ($\lambda_g = 1.1, 1.05, 1.0$ and 0.95 μm for the respective layers in the direction away from the active layer 607; thickness in total = 100 nm), a p-cladding layer 606 made of p-type InP, and a p+-cap layer 611 made of p+-type InGaAsP ($\lambda_g = 1.3$ μm). Within the active layer 607, a plurality of quantum well layers 603 each made of InGaAsP ($\lambda_g = 1.37$ μm; thickness = 8 nm), and a plurality of barrier layers 604 each made of InGaAsP ($\lambda_g = 1.1$ μm; thickness = 12 nm) are stacked in alternating manner. In this example, the active layer 607 has nine (9) quantum well layers 603 and seven (7) barrier layers 604.

The above laminated structure is obtained by sequentially growing on the substrate 608 each of the layers 601, 602, 607, 605, 606 and 611 by use of conventional epitaxial growth method. The laminated structure is then subjected to etching treatment to form a stripe-shaped portion 607'. This stripe-shaped portion is provided on both of its side faces with a current blocking layer including a p-type InP layer 609 and an n-type InP layer 610 in a manner as shown in FIG. 6. An electrode 612 is formed on the bottom face of the substrate 608, and another electrode 613 is formed to be in contact with the p+-cap layer 611 and the n-type InP layer 610, thereby resulting in the semiconductor laser device of this example. In this semiconductor laser device, the active layer 607 which serves as the resonator has the length $L_c$ of 350 μm along the direction of the resonator, as shown in FIG. 6.

Figure 7:
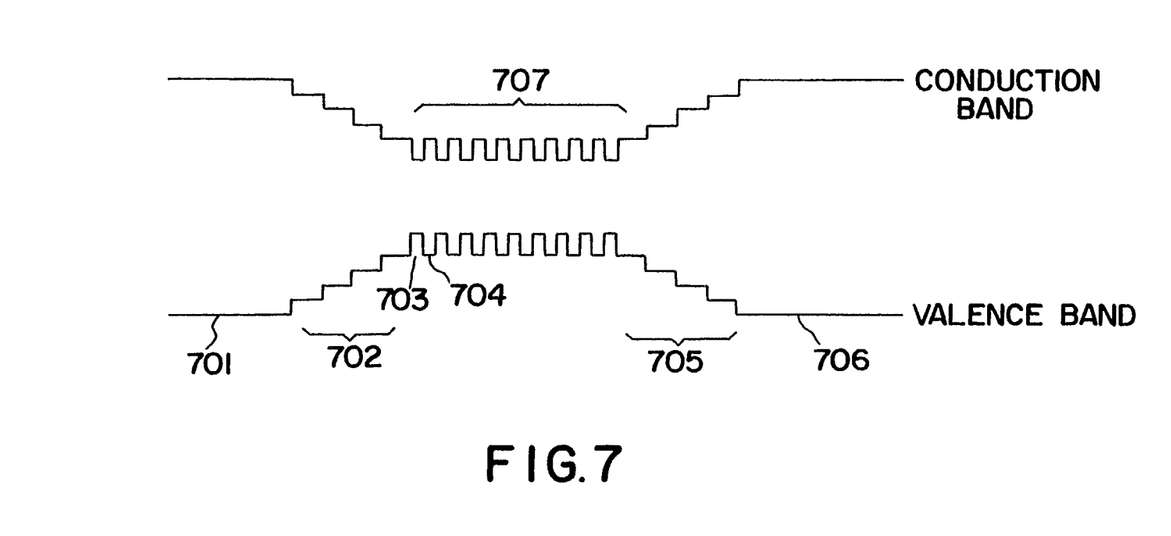
FIG. 7 is a conceptual view illustrating the energy band structure of and around the quantum well structure of the semiconductor laser device of FIG. 6.

FIG. 7 illustrates the energy band structure of and around the active layer of the above semiconductor laser device.

An energy band of the portion 707 of the energy band structure in FIG. 7 corresponds to the energy band of the active layer 607 in FIG. 6. Further in FIG. 7, energy bands 701, 702, 703, 704, 705 and 706 respectively represent the energy bands of the n-cladding layer 601, the first guide layer 602, the quantum well layer 603, the barrier layer 604, the second guide layer 605 and the p-cladding layer 606. The stepwise changes shown in the energy bands 702 and 705 reflect the GRIN-SCH structures of the first guide layer 602 and the second guide layer 605. However, the semiconductor laser device of this example may include a guide layer having uniform composition ratio along the transverse direction of the layer.

As mentioned above, the quantum well semiconductor laser device of this example has nine (9) quantum well layers and the resonator length of 350 μm. However, advantages of this invention are most preferably realized as long as a quantum well semiconductor laser device has the number of the quantum well layers in the range of 6 to 10, and the resonator length in the range of 250 μm to 700 μm. The reason for these specific ranges being preferred will be described below.

Figure 8:
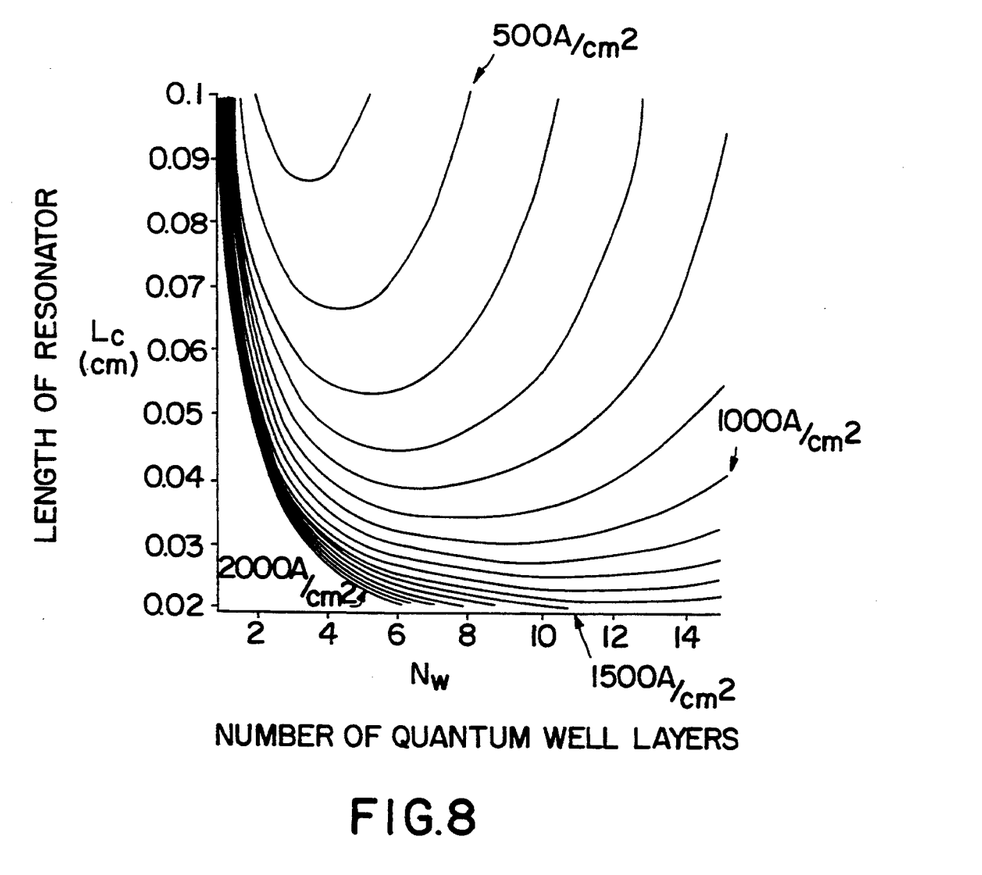
FIG. 8 is a graph illustrating variation of threshold current densities of semiconductor laser devices, as functions of the length of the resonator and the number of the quantum well layers, where the semiconductor laser devices are made of InGaAsP/InP type materials and have guide layers with a GRIN-SCH structure.

FIG. 8 illustrates variation of threshold current densities as functions of the length $L_c$ of the resonator and the number $N_w$ of the quantum well layers, for semiconductor laser devices such as that obtained in Example 2 (i.e., quantum well semiconductor laser devices which are made of InGaAsP/InP type materials and have a pair of guide layers each having a GRIN-SCH structure). As a quantum well semiconductor laser device has larger number of quantum well layers, it can achieve larger gain for a fixed amount of injected carriers and thus have a lower threshold current density for laser oscillation. However, when the number of quantum well layers increases beyond a certain point, effect of the increased volume of those quantum well layers dominates the effect of the increased gain, and thus the threshold current density begins to increase again. In other words, a quantum well semiconductor laser device including a resonator of a fixed length has an optimum number with regard to its quantum well layers, by which the lowest threshold current density can be achieved. As can be seen from FIG. 8, this optimum number increases as the resonator length $L_c$ decreases. This means that as a quantum well semiconductor laser device has larger number of quantum well layers, smaller resonator length becomes appropriate to achieve the lowest threshold current density.

With regard to quantum well semiconductor laser devices each having a varied resonator length $L_c$ and an optimum value for the number $N_w$ of quantum well layers to achieve the lowest of its threshold current density $J_{th}$, the number $N_w$ can be correlated respectively with the threshold current Ith, the differential quantum efficiency $\eta_d$ and the threshold current density $J_{th}$ according to the following formulae (II) through (IV):

$$I_{th}=[C_1/(A_1N_w-B_1)]+D_1 \qquad (II)$$

$$\eta_d=E_2/[C_2/(A_2N_w-B_2)+D_2] \qquad (III)$$

$$J_{th}/N_w=A_3 \qquad (IV)$$

wherein $A_1$, $B_1$, $C_1$, $D_1$, $A_2$, $B_2$, $C_2$, $D_2$, $E_2$ and $A_3$ are constants.

It can be seen from he formulae (II) and (III) that as a quantum well semiconductor laser device has larger number of quantum well layers, it has a decreased threshold current $I_{th}$ and an increased differential quantum efficiency $\eta_d$.

On the other hand, when quantum well semiconductor laser devices each having a fixed $N_w$ value and a varied $L_c$ value are considered, increase in the resonator length $L_c$ leads to decrease in the threshold current density $J_{th}$ and thus to decrease in the threshold current density per each quantum well layer, which corresponds to $A_3$ in formula (IV). Therefore, as a quantum well semiconductor laser device has a longer resonator length, it can better reduce the above-mentioned overflow of injected carriers and thus shows more improved temperature characteristics enabling higher optical output even at high temperature.

When a quantum well semiconductor laser device has an excessively long resonator, however, effect of internal heat evolution becomes significant and thus the temperature within the device rises, resulting in deterioration of characteristics of the device. As described above, a quantum well semiconductor laser device having a smaller number of quantum well layers requires a longer resonator length in order to achieve the lowest threshold current density. Therefore, in view of reducing the undesired effect of heat evolution, a quantum well semiconductor device should have a larger number of quantum well layers, preferably more than 6, and more preferably more than 8.

Figure 9A:
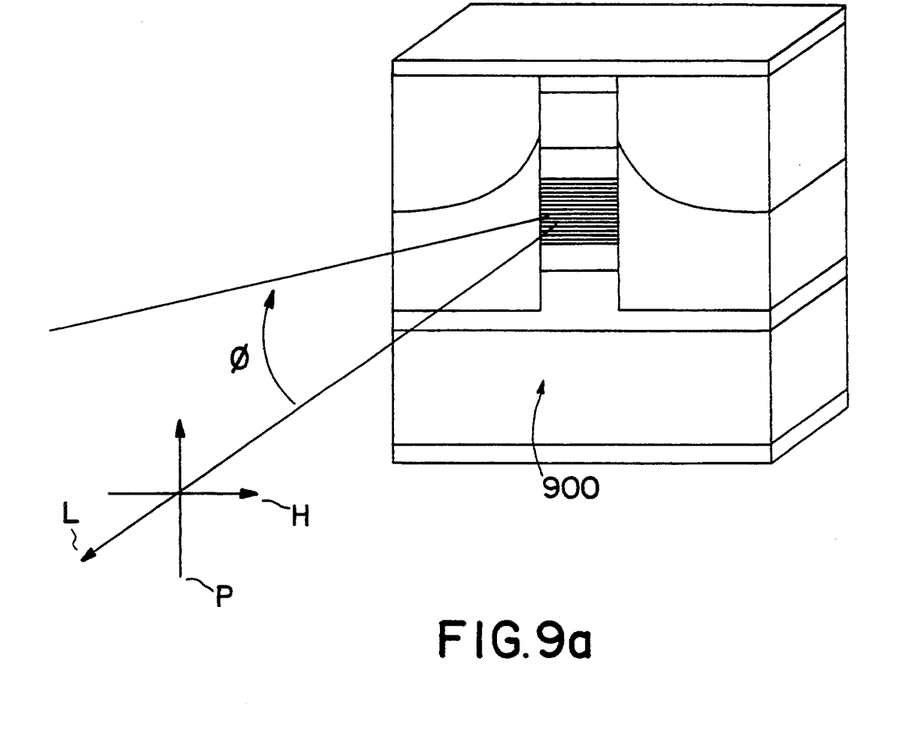
FIG. 9a is a schematic view illustrating an angle $\phi$ measured from the perpendicular line which is perpendicular to a light emitting face of a semiconductor laser device.
Figure 9B:
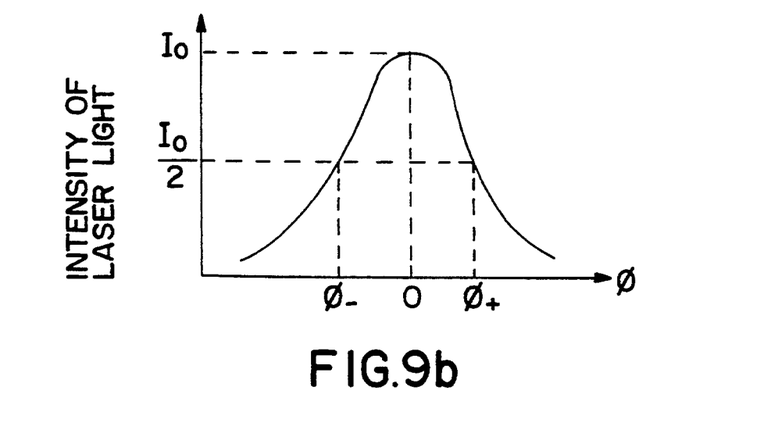
FIG. 9b is a graph illustrating a relationship between the angle $\phi$ and intensity of emitted laser light in view of determining the spreading angle $\theta$ of laser light.

On the other hand, a quantum well semiconductor laser device having a larger number of quantum well layers has a more enlarged spreading angle $\theta$ when the spreading angle is measured in the direction perpendicular to the quantum well layers. Herein the spreading angle $\theta$ is determined in the manner as described with respect to FIGS. 9a and 9b. In FIG. 9a, an angle $\phi$ is the angle measured from a perpendicular vector L which is perpendicular to a light emitting face 900 of a semiconductor laser device such as shown in Example 2, and which represents the principal propagation direction of light emitted therefrom. A direction arrow P represents the direction perpendicular to the alignment of the quantum well layers of the device. A direction arrow H represents the direction horizontal to the alignment of the quantum well layers of the device. FIG. 9b illustrates a relationship between the angle $\phi$ and intensity of the emitted laser light. In FIG. 9b, $I_0$ represents the maximum intensity of the laser light and $\phi_-$ and $\phi_+$ represent the angles where intensity of the emitted laser light becomes one half of $I_0$. The spreading angle e is defined as the absolute value of $(\phi_+ - \phi_-)$.

Figure 10:
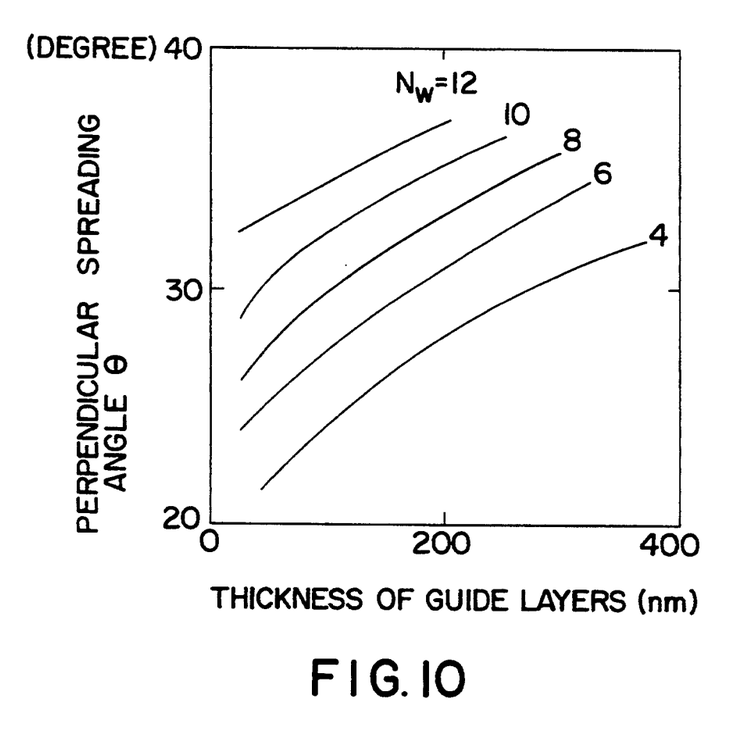
FIG. 10 is a graph illustrating relationships between the spreading angle $\Theta$ and the thickness of the guide layers for semiconductor laser devices having varied number of quantum well layers.

FIG. 10 illustrates relationships between the perpendicular spreading angle $\theta$ (i.e., the spreading angle $\theta$ measured in the direction perpendicular to the quantum well layers, that is, in the plane containing arrow P and vector L) and the thickness of the guide layers for semiconductor laser devices having varied number of quantum well layers. Data shown in this graph are obtained from semiconductor laser devices which are made of InGaAsP/InP type materials and have first and second guide layers each having a GRIN-SCH structure and an equal thickness, as in the case of the device prepared in Example 2. As can be seen from FIG. 10, a larger number of quantum well layers is accompanied by a more enlarged perpendicular spreading angle $\theta$. On the other hand, the horizontal spreading angle $\theta$ (i.e., the spreading angle $\theta$ of a quantum well semiconductor laser device measured in the direction horizontal to the quantum well layers, that is, in the plane containing arrow H and vector L) is generally known to be about 25°. Thus, by approximating the perpendicular spreading angle $\theta$ to 25°, the elliptic ratio (i.e., ratio of the perpendicular spreading angle to the horizontal spreading angle) can be closer to one (1), thereby enabling the semiconductor laser device to achieve higher coupling efficiency with an optical fiber and the like. The perpendicular spreading angle $\theta$ is preferably not more than 30°. Therefore, from FIG. 10, the number of quantum well layers is preferably not more than 10.

It can be also seen from FIG. 10 that even when the number of quantum well layers is small, such as $N_w=4$, an appropriate perpendicular spreading angle $\theta$ can be obtained by increasing the thicknesses of guide layers. However, excessive increase in the thicknesses of the guide layers is undesirable because it can result in reducing efficiency for injecting carriers into the quantum well layer placed between these guide layers. When a guide layer has a GRIN-SCH structure, the thicknesses thereof is preferably in the range of about 20 nm to about 200 nm.

As has been discussed above, in order to realize a low threshold current density and desirable temperature characteristics, and at the same time secure the perpendicular spreading angle $\theta$ within an appropriate range, a semiconductor laser device of this invention has the number of quantum well layers preferably in the range of 6 to 10. Also, in order to realize a low threshold current density and desirable temperature characteristics, and at the same time restrict the undesired internal heat evolution, a semiconductor laser device of this invention has the length of its resonator preferably in the range of 250 μm to 700 μm, and more preferably in the range of 250 μm to 400 μm.

The semiconductor laser device obtained in Example 2, which has nine (9) quantum well layers and the resonator length of 350 μm, shows excellent temperature characteristics at high temperature, as indicated by the characteristic temperature $T_0$ of 60 Kelvin(K.), and provides optical output of sufficiently high intensity. In addition, this device has the perpendicular spreading angle $\theta$ of 30°, which falls within the above-mentioned desirable range.

As can be seen from the above examples, the present invention provides a semiconductor laser device which has improved temperature characteristics and generates optical output of sufficiently high intensity even when operated at high temperature, and which can also realize high coupling efficiency with photoreceiving device such as an optical fiber and the like.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor laser device having a resonator, comprising:

a substrate; and a laminated structure formed on a top face of the substrate, the laminated structure including (a) first and second guide layers and (b) a quantum well structure of compound semiconductor interposed between the first and second guide layers, the quantum well structure serving as the resonator and including at least one quantum well layer and at least one barrier layer; and wherein the quantum well layer has a thickness $L_z$ and the barrier layer has the energy gap larger than the energy gap of the quantum well layer so as to form a energy difference $V_0$ between the bottom of the conduction band of the quantum well layer and the bottom of the conduction band of the barrier layer; and wherein the relationship represented by formula (I) is satisfied:

$$L_z < h/2(2m^*V_0)^{\frac{1}{2}} \qquad (I)$$

wherein h is Planck's constant and m is the effective mass of electrons within the quantum well layer.

2. The device according to claim 1, wherein the first and second guide layers respectively have a Graded Index Separate Confinement Heterostructure.

3. The device according to claim 1, further comprising a current blocking layer, and wherein the laminated structure has a stripe-shaped geometry and is placed in contact with the current blocking layer on the side faces of the stripe-shaped geometry.

4. The device according to claim 1, wherein the quantum well structure has a single quantum well layer.

5. The device according to claim 1, wherein the quantum well structure has a plurality of quantum well layers and a plurality of barrier layers stacked in alternating manner.

6. The device according to claim 5, wherein the number of the quantum well layers is in the range of 6 to 10.

7. The device according to claim 6, wherein the length of the resonator is in the range of 250 μm to 700 μm.

8. The device according to claim 6, wherein the thicknesses of the first and second guide layers are selected so as to give a laser light emitted from the device a perpendicular spreading angle in the range of about 25° to about 30°.

* * * * *

UNITED STATES PATENT AND TRADEMARK OFFICE
CERTIFICATE OF CORRECTION

PATENT NO. : 5,375,135
DATED : December 20, 1994
INVENTOR(S) : Toshiyuki Okumura It is certified that error appears in the above-indentified patent and that said Letters Patent is hereby corrected as shown below:

Title page, item [57]:
In the Abstract:
Line 16: "$L_z < h/2(2m^*V_0)^{1/2}$" should read --$L_z \leq h/2(2m^*V_0)^{1/2}$--;

Column 4, line 25: "$L_z < h/2(2m^*V_0)^{1/2}$"
should read --$L_z \leq h/2(2m^*V_0)^{1/2}$--;

column 8, line 57: after "angle" substitute "e" with --$\theta$--;

column 10, line 32: "$L_z < h/2(2m^*V_0)^{1/2}$"
should read --$L_z \leq h/2(2m^*V_0)^{1/2}$--;

column 10, line 34: "and m is" should read --and m* is--.

Signed and Sealed this

Eighteenth Day of April, 1995

Attest:

BRUCE LEHMAN

*Commissioner of Patents and Trademarks*

*Attesting Officer*

UNITED STATES PATENT AND TRADEMARK OFFICE
CERTIFICATE OF CORRECTION

PATENT NO. : 5,375,135
DATED : December 20, 1994
INVENTOR(S) : TOSHIYUKI OKUMURA et al.

It is certified that error appears in the above-indentified patent and that said Letters Patent is hereby corrected as shown below:

```
On the title page, item [73]:

IS:         Sharp Kabushiki Kaisha, Osaka, Japan
    SHOULD BE:  Sharp Kabushiki Kaisha, Osaka, Japan
                The Furukawa Electric Co, Ltd, Tokyo, Japan.
```

Signed and Sealed this

Twenty-sixth Day of September, 1995

Attest:

BRUCE LEHMAN

*Attesting Officer*          *Commissioner of Patents and Trademarks*